(12) United States Patent
Yamada et al.

(10) Patent No.: US 9,859,315 B2
(45) Date of Patent: Jan. 2, 2018

(54) RADIATION IMAGE-PICKUP DEVICE AND RADIATION IMAGE-PICKUP DISPLAY SYSTEM

(71) Applicant: Sony Corporation, Tokyo (JP)

(72) Inventors: Yasuhiro Yamada, Kanagawa (JP); Makoto Takatoku, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 14/320,826

(22) Filed: Jul. 1, 2014

(65) Prior Publication Data

US 2015/0021594 A1 Jan. 22, 2015

(30) Foreign Application Priority Data

Jul. 17, 2013 (JP) ................ 2013-148272

(51) Int. Cl.
*H01L 27/146* (2006.01)
*H01L 29/49* (2006.01)
*H01L 29/786* (2006.01)

(52) U.S. Cl.
CPC .. *H01L 27/14616* (2013.01); *H01L 27/14603* (2013.01); *H01L 27/14612* (2013.01); *H01L 27/14658* (2013.01); *H01L 29/4908* (2013.01); *H01L 29/78648* (2013.01)

(58) Field of Classification Search
CPC ......... H01L 27/14616; H01L 27/14603; H01L 27/14612; H01L 27/14658; H01L 29/4908; H01L 29/78648; H01L 21/02129; H01L 21/02126
See application file for complete search history.

(56) References Cited

U.S. PATENT DOCUMENTS 5,536,932 A * 7/1996 Hack et al. ................. 250/208.1
5,574,294 A * 11/1996 Shepard ........................... 257/66
5,605,848 A * 2/1997 Ngaoaram ........ H01L 21/28176
257/E21.194

(Continued)

FOREIGN PATENT DOCUMENTS

JP 2004-265935 A 9/2004
JP 2008-252074 A 10/2008

OTHER PUBLICATIONS

Wright, et al., "The Effect of Fluourine in Silicon Dioxide Gate Dielectrics", IEEE Trans. on Elec. Dev., vol. 36, No. 5, May 1989, pp. 879-889.*

(Continued)

*Primary Examiner* — Tom Thomas
*Assistant Examiner* — Vincent Wall
(74) *Attorney, Agent, or Firm* — Wolf, Greenfield & Sacks, P.C.

(57) ABSTRACT

A radiation image-pickup device includes: a plurality of pixels configured to generate signal charge based on radiation; and a field effect transistor used to read out the signal charge from the plurality of pixels. The transistor includes a first silicon oxide film, a semiconductor layer, and a second silicon oxide film laminated in order from a substrate side, the semiconductor layer including an active layer, and a first gate electrode disposed to face the semiconductor layer, with the first or the second silicon oxide film interposed therebetween, and the first or the second silicon oxide film or both include an impurity element.

20 Claims, 16 Drawing Sheets

(56) References Cited

U.S. PATENT DOCUMENTS

| | | | | |
|---|---|---|---|---|
| 6,246,070 | B1* | 6/2001 | Yamazaki | G02F 1/136227 |
| | | | | 257/347 |
| 2003/0025158 | A1* | 2/2003 | Makita | H01L 27/1277 |
| | | | | 257/347 |
| 2005/0158929 | A1* | 7/2005 | Yamazaki | H04N 9/3173 |
| | | | | 438/166 |
| 2005/0224799 | A1* | 10/2005 | Yamamoto | H01L 29/66757 |
| | | | | 257/66 |
| 2005/0285043 | A1* | 12/2005 | Nascetti | G01T 1/026 |
| | | | | 250/370.09 |
| 2012/0248633 | A1* | 10/2012 | Fukuda | H01L 51/003 |
| | | | | 257/787 |

OTHER PUBLICATIONS

Bondarenko, et al., "Plasma and injections modification of the gate dielectric in MOS structres", Thin Solid Films, 427, 2003, pp. 377-380.*

Lee, et al., "Low Temperature Poly-Si Thin-Film Transistor Fabrication by Metal-Induced Lateral Crytallization", IEEE Elec. Dev. Lett., vol. 17, No. 4, Apr. 1996, p. 160-162.*

Weinheim, Wiley-VCH Verlag GmbH & Co., "Luminescence: From Theory to Applications", ISBN: 978-3-527-31402-7, 2008, pp. 1-34.*

Chang et al., "High-Performance RSD Poly-Si TFTs with a new ONO Gate Dielectric", IEEE Trans. Elec. Dev., vol. 51, No. 6, Jun. 2004, pp. 995-1001.*

* cited by examiner

RADIATION IMAGE-PICKUP DEVICE AND RADIATION IMAGE-PICKUP DISPLAY SYSTEM

CROSS REFERENCE TO RELATED APPLICATIONS

This application claims the benefit of Japanese Priority Patent Application JP2013-148272 filed Jul. 17, 2013, the entire contents of which are incorporated herein by reference.

BACKGROUND

The present disclosure relates to, for example, a radiation image-pickup device obtaining an image based on radiation, and a radiation image-pickup display system including such a radiation image-pickup device.

For example, radiation image-pickup devices that may obtain an image signal based on radiation such as X-rays have been proposed (for example, Japanese Unexamined Patent Application Publication Nos. 2008-252074 and 2004-265935).

SUMMARY

In the above-described radiation image-pickup devices, a thin film transistor (TFT) is used as a switching element provided to read signal charge based on the radiation from each pixel. Such a transistor has been expected to have an improved life property.

It is desirable to provide a radiation image-pickup device allowing an improvement in a transistor element life, and a radiation image-pickup display system including such a radiation image-pickup device.

According to an embodiment of the present disclosure, there is provided a radiation image-pickup device including: a plurality of pixels configured to generate signal charge based on radiation; and a field effect transistor used to read out the signal charge from the plurality of pixels, wherein the transistor includes a first silicon oxide film, a semiconductor layer, and a second silicon oxide film laminated in order from a substrate side, the semiconductor layer including an active layer, and a first gate electrode disposed to face the semiconductor layer, with the first or the second silicon oxide film interposed therebetween, and the first or the second silicon oxide film or both include an impurity element.

According to an embodiment of the present disclosure, there is provided a radiation image-pickup display system including: a radiation image-pickup device; and a display configured to perform image display based on an image pickup signal obtained by the radiation image-pickup device, wherein the radiation image-pickup device includes a plurality of pixels configured to generate signal charge based on radiation, and a field effect transistor used to read out the signal charge from the plurality of pixels, the transistor includes a first silicon oxide film, a semiconductor layer, and a second silicon oxide film laminated in order from a substrate side, the semiconductor layer including an active layer, and a first gate electrode disposed to face the semiconductor layer, with the first or the second silicon oxide film interposed therebetween, and the first or the second silicon oxide film or both include an impurity element.

In the radiation image-pickup device and the radiation image-pickup display system according to the above-described embodiments of the present disclosure, the transistor, which is used to read out the signal charge from each of the pixels, includes the first silicon oxide film, the semiconductor layer, and the second silicon oxide film laminated in order from the substrate side. The transistor further includes the first gate electrode disposed to face the semiconductor layer, with the first or the second silicon oxide film interposed therebetween. The first or the second silicon oxide film or both include the impurity element and therefore, electrical neutralization is allowed even when electric charge such as a positive hole is generated due to entrance of radiation. This suppresses a shift in a threshold voltage of the transistor to a negative side (a minus side).

According to the radiation image-pickup device and the radiation image-pickup display system of the above-described embodiments of the present disclosure, the transistor, which is used to read out the signal charge from each of the pixels, includes the first silicon oxide film, the semiconductor layer, and the second silicon oxide film laminated in order from the substrate side. The transistor further includes the first gate electrode disposed to face the semiconductor layer, with the first or the second silicon oxide film interposed therebetween. The first or the second silicon oxide film or both include the impurity element and therefore, characteristic deterioration of the transistor due to entrance of radiation is allowed to be suppressed. Accordingly, an improvement in transistor element life is allowed.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the present disclosure, and are incorporated in and constitute a part of this specification. The drawings illustrate embodiments and, together with the specification, serve to describe the principles of the technology.

DETAILED DESCRIPTION

An embodiment of the present disclosure will be described below in detail with reference to the drawings. It is to be noted that the description will be provided in the following order.
1. Embodiment (an example of a radiation image-pickup device using a dual-gate TFT containing an impurity element in a silicon oxide film)
2. Modification 1 (another example of the dual-gate TFT)
3. Modification 2 (an example using a top-gate TFT)
4. Modification 3 (an example using a bottom-gate TFT)
5. Modification 4 (an example of another passive pixel circuit)
6. Modification 5 (an example of still another passive pixel circuit)
7. Modifications 6-1 and 6-2 (examples of an active pixel circuit)
8. Application example (an example of a radiation image-pickup display system)

Embodiment

[Configuration]

Figure 1:
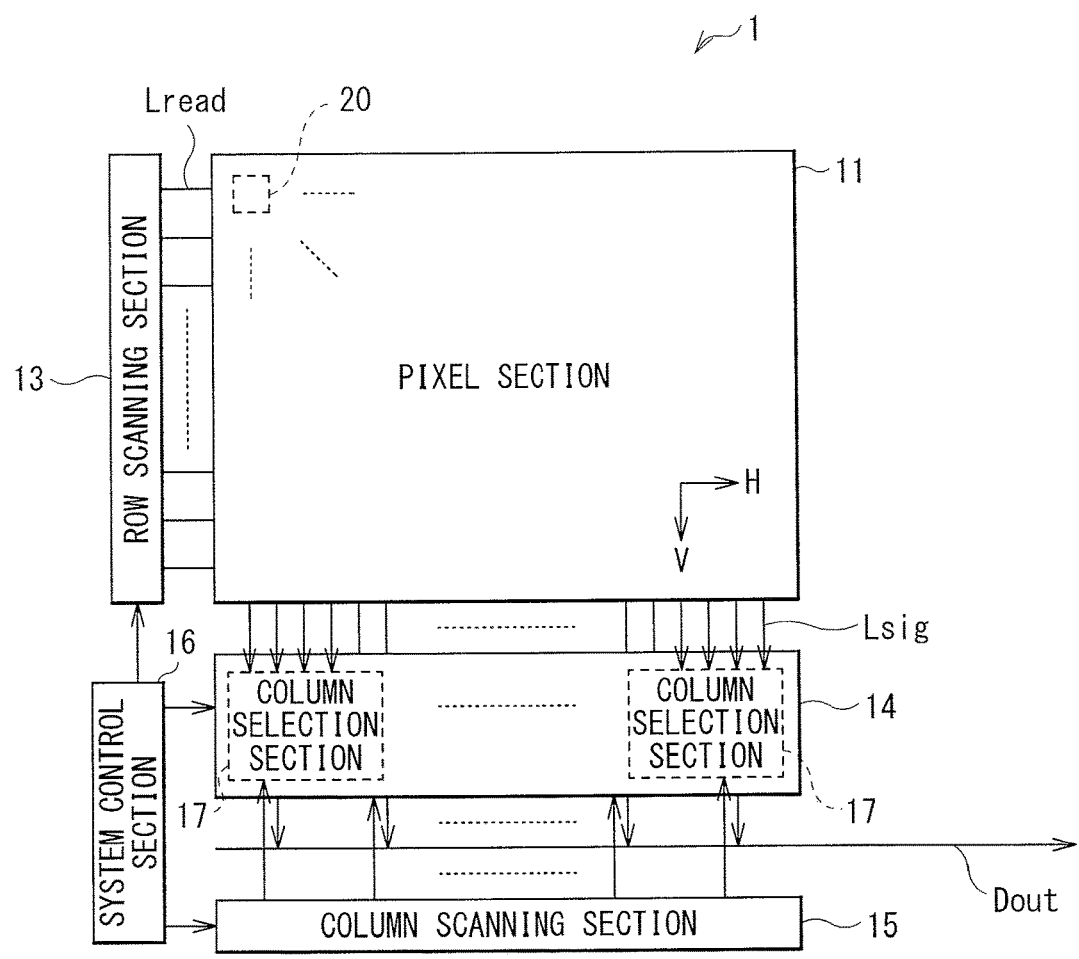
FIG. 1 is a block diagram illustrating an overall configuration of a radiation image-pickup device according to an embodiment of the present disclosure.

FIG. 1 illustrates an overall block configuration of a radiation image-pickup device (a radiation image-pickup device 1) according to an embodiment of the present disclosure. The radiation image-pickup device 1 may, for example, read information of a subject (picks up an image of a subject) based on entering radiation Rrad (such as alpha rays, beta rays, gamma rays, and X-rays). The radiation image-pickup device 1 includes a pixel section 11. The radiation image-pickup device 1 further includes, as drive circuits of the pixel section 11, a row scanning section 13, an A/D conversion section 14, a column scanning section 15, and a system control section 16.

(Row Scanning Section 13)

The row scanning section 13 includes a shift register circuit to be described later, a predetermined logical circuit, etc. The row scanning section 13 is a pixel driving section (a row scanning circuit) that performs driving (line-sequential scanning) of a plurality of pixels 20 in the pixel section 11 row by row (by a horizontal line unit), each to be described later. Specifically, the row scanning section 13 may perform image pickup operation such as reading operation and reset operation of each of the pixels 20 by, for example, line-sequential scanning. It is to be noted that, this line-sequential scanning is performed by supplying the above-described row scanning signal to each of the pixels 20 through the readout control line Lread.

(A/D Conversion Section 14)

The A/D conversion section 14 includes a plurality of column selection sections 17 each provided for each plurality of (here, four) signal lines Lsig. The A/D conversion section 14 performs A/D conversion (analog-to-digital conversion) based on a signal voltage (a voltage corresponding to the signal charge) inputted through the signal line Lsig. As a result, output data Dout (an image pickup signal) that is a digital signal is generated and then outputted to outside.

(Pixel Section 11)

Figure 2A:
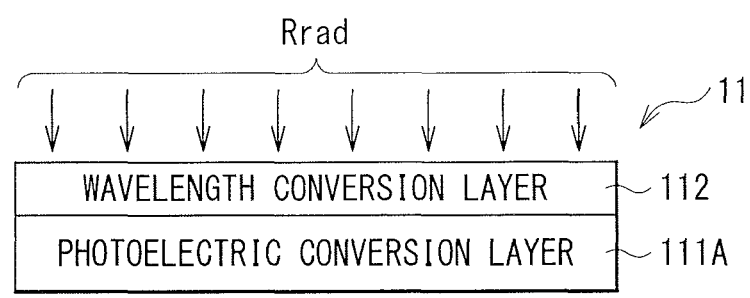
FIG. 2A is a schematic diagram illustrating a schematic configuration of a pixel section in a case of an indirect conversion type.
Figure 2B:
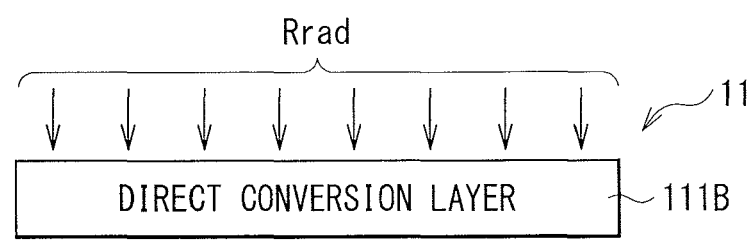
FIG. 2B is a schematic diagram illustrating a schematic configuration of a pixel section in a case of a direct conversion type.

The pixel section 11 includes a plurality of pixels (image pickup pixels, or unit pixels) 20 generating signal charge based radiation. The pixels 20 are two-dimensionally arranged in rows and columns (in a matrix). It is to be noted that, in the following, a horizontal direction (a row direction) in the pixel section 11 will be referred to as an "H" direction, and a vertical direction (a column direction) will be referred to as a "V" direction, as illustrated in FIG. 1. The radiation image-pickup device 1 may be either of, so-called, an indirect conversion type and a direct conversion type, if a transistor 22, to be described later, is used as a switching element provided to read the signal charge from the pixel section 11. FIG. 2A illustrates a configuration of the pixel section 11 of the indirect conversion type, and FIG. 2B illustrates a configuration of the pixel section 11 of the direct conversion type.

In the case of the indirect conversion type (FIG. 2A), the pixel section 11 includes a wavelength conversion layer 112 on a photoelectric conversion layer 111A (on a light-receiving-surface side). The wavelength conversion layer 112 converts the radiation Rrad to a wavelength in a sensitivity range of the photoelectric conversion layer 111A (for example, visible light). The wavelength conversion layer 112 may be configured of a phosphor (for example, a scintillator such as CsI (Tl-added), $Gd_2O_2S$, BaFX (X is Cl, Br, I, or the like), NaI, and $CaF_2$) converting X-rays to visible light, for example. The wavelength conversion layer 112 described above is formed on the photoelectric conversion layer 111A, with a flattening film interposed therebetween. Examples of a material of the flattening film may include an organic material and a spin-on-glass material. The photoelectric conversion layer 111A includes a photoelectric conversion element (a photoelectric conversion element 21 to be described later) such as a photodiode.

In the case of the direct conversion type (FIG. 2B), the pixel section 11 includes a conversion layer (a direct conversion layer 111B) that generates an electric signal (a positive hole and an electron) by absorbing the radiation Rrad. The direct conversion layer 111B may be configured of, for example, a material such as an amorphous selenium (a-Se) semiconductor and a cadmium tellurium (CdTe) semiconductor.

In this way, the radiation image-pickup device 1 may be of either the indirect conversion type or the direct conversion type. However, the following embodiment and the like will be described by taking mainly the case of the indirect conversion type as an example. In other words, in the pixel section 11, as will be described later in detail, the radiation Rrad is converted to visible light in the wavelength conversion layer 112, and this visible light is converted to an electric signal in the photoelectric conversion layer 111A (the photoelectric conversion element 21), to be read out as signal charge.

Figure 3:
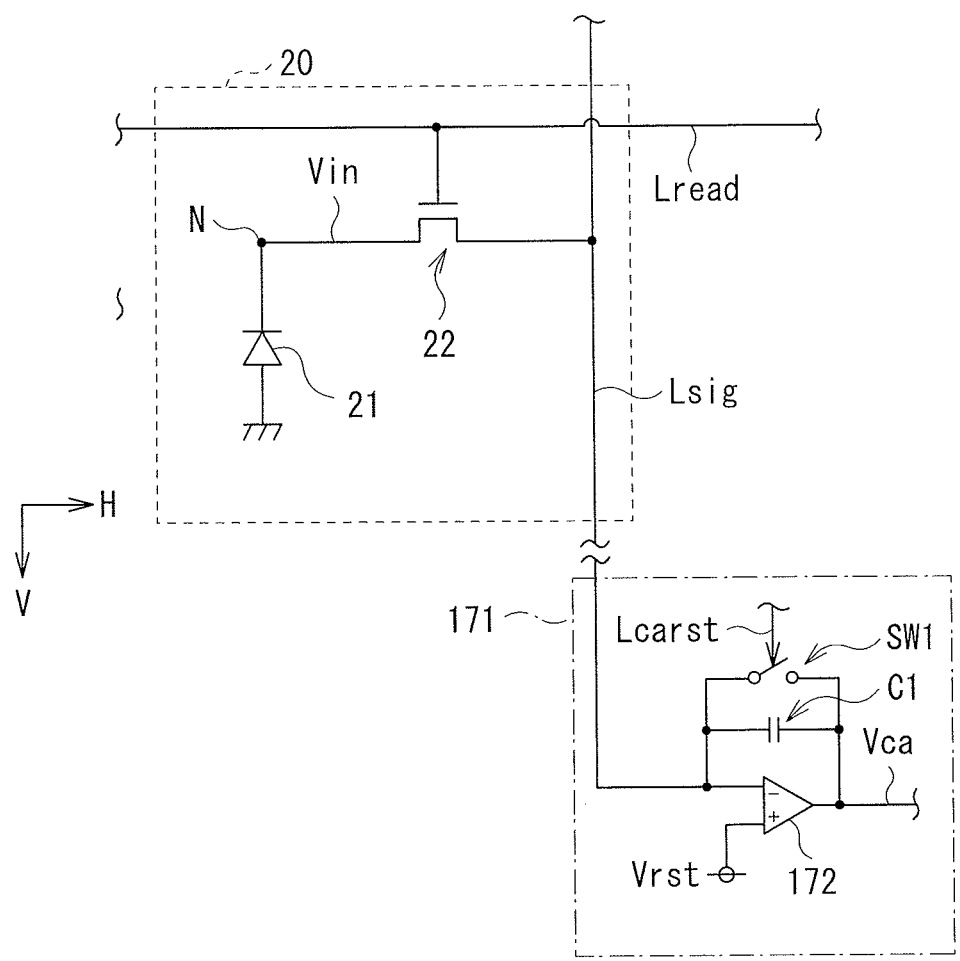
FIG. 3 is a circuit diagram illustrating a detailed configuration example of components including a pixel illustrated in FIG. 1.

FIG. 3 illustrates an example of a circuit configuration (a so-called passive circuit configuration) of the pixel 20, together with a circuit configuration of a charge amplifier circuit 171 to be described later provided in the A/D conversion section 14. The passive pixel 20 may include, for example, the one photoelectric conversion element 21 and one transistor 22. Further, a readout control line Lread extending in the H direction and a signal line Lsig extending in the V direction are connected to the pixel 20.

The photoelectric conversion element 21 may be configured using, for example, a positive-intrinsic-negative (PIN) photodiode or a metal-insulator-semiconductor (MIS) sensor, and generates the signal charge of a charge amount corresponding to an entering light quantity, as described above. It is to be noted that, here, a cathode of the photoelectric conversion element 21 is connected to a storage node N.

The transistor 22 is a transistor (a readout transistor) that outputs the signal charge (an input voltage Vin) obtained by the photoelectric conversion element 21 to the signal line Lsig, by changing to an ON state in response to a row scanning signal supplied through the readout control line Lread. The transistor 22 may be configured using, for example, an N-channel-type (N-type) field effect transistor (FET). However, the transistor 22 may be configured using other type such as a P-channel-type (P-type) FET.

Figure 4:
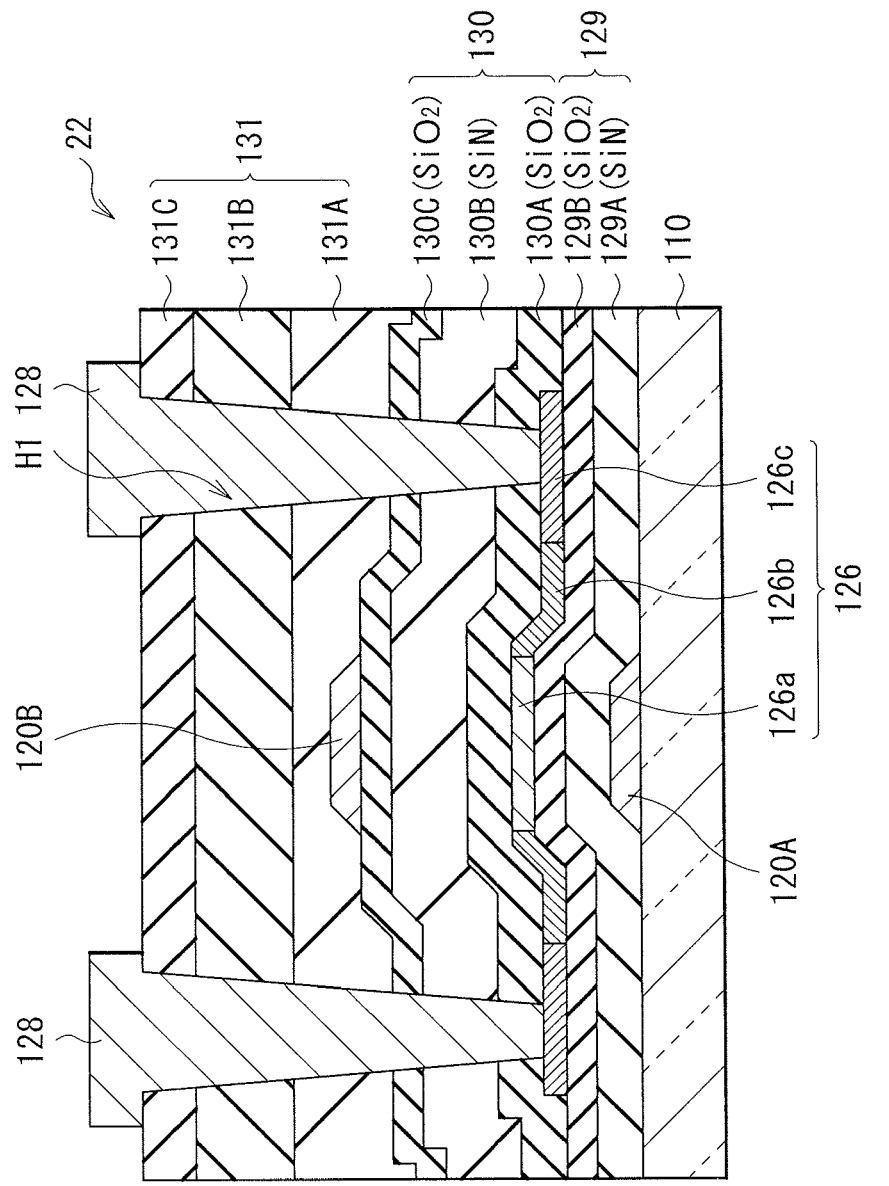
FIG. 4 is a cross-sectional diagram illustrating a configuration of a transistor illustrated in FIG. 3.

FIG. 4 illustrates a cross-sectional configuration of the transistor 22. In the present embodiment, the transistor 22 has an element structure of a so-called dual-gate-type (both-side-gate or double-gate type) thin-film transistor. The transistor 22 may include, for example, a first gate electrode 120A, a first gate insulating film 129 (a first gate insulating film), a semiconductor layer 126, a second gate insulating film 130 (a second gate insulating film), a second gate electrode 120B in this order on a substrate 110. On the second gate electrode 120B, an interlayer insulating film 131 is formed. Further, a contact hole H1 passing through the interlayer insulating film 131 and the second gate insulating film 130 is formed. On the interlayer insulating film 131, source-drain electrodes 128 are each formed to fill the contact hole H1. It is to be noted that a not-illustrated interlayer insulating film is further formed on the source-drain electrodes 128.

The semiconductor layer 126 may include, for example, a channel layer (an active layer) 126a, a lightly doped drain (LDD) layer 126b, and an N+ layer 126c. The semiconductor layer 126 may be configured using, for example, a silicon system semiconductor such as amorphous silicon, microcrystal silicon, and poly-silicon, and preferably, low temperature poly-silicon (LTPS) may be used. Alternatively, the semiconductor layer 126 may be configured using an oxide semiconductor such as indium gallium zinc oxide (InGaZnO) and zinc oxide (ZnO). However, effects of the present embodiment to be described later are significant, in particular, when the semiconductor layer 126 is configured using the low temperature poly-silicon. The LDD layer 126b is formed between the channel layer 126a and the N+ layer 126c, to reduce a leakage current.

The source-drain electrode 128 serves as a source or a drain. The source-drain electrode 128 may be, for example, a single layer film made of any of elements including titanium (Ti), aluminum (Al), molybdenum (Mo), tungsten (W), and chromium (Cr), or may be a laminated film including two or more of these elements.

The first gate electrode 120A and the second gate electrode 120B may each be, for example, a single layer film made of any of elements including molybdenum, titanium, aluminum, tungsten, and chromium, or may be a laminated film including two or more of these elements. The first gate electrode 120A is provided to face the semiconductor layer 126 (specifically, the channel layer 126a), with the second gate insulating film 130 interposed between (of the semiconductor layer 126, a region facing the first gate electrode 120A is the channel layer 126a). Further, the first gate electrode 120A and the second gate electrode 120B are provided to face each other with the semiconductor layer 126 interposed between. For example, voltages equal to each other may be applied to the first gate electrode 120A and the second gate electrode 120B.

(Configuration of Gate Insulating Film)

The first gate insulating film 129 and the second gate insulating film 130 may each include, for example, a silicon oxide film (a silicon compound film including oxygen) made of a material such as silicon oxide (SiOx) and silicon oxynitride (SiON). Specifically, for example, the first gate insulating film 129 and the second gate insulating film 130 may each be a single layer film made of a material such as silicon oxide and silicon oxynitride, or may each be a laminated film including such a silicon oxide film and a silicon nitride film made of silicon nitride (SiNx). In either of the first gate insulating films 129 and the second gate insulating film 130, the above-described silicon oxide film is provided on the semiconductor layer 126 side (to be adjacent to the semiconductor layer 126). When the semiconductor layer 126 is made of, for example, the low temperature poly-silicon, a silicon oxide film may be formed to be adjacent to the semiconductor layer 126, for a reason in a manufacturing process.

The first gate insulating film 129 and the second gate insulating film 130 may each be, preferably, a laminated film including the silicon oxide film and the silicon nitride film described above. Here, the first gate insulating film 129 and the second gate insulating film 130 are each a laminated film. Specifically, the first gate insulating film 129 may be, for example, a laminated film including a silicon nitride film 129A and a silicon oxide film 129B in this order from the substrate 110 side. The second gate insulating film 130 may be, for example, a laminated film including a silicon oxide film 130A, a silicon nitride film 130B, and a silicon oxide film 130C in this order from the semiconductor layer 126 side. It is to be noted that, the silicon oxide film 129B of the present embodiment is equivalent to a specific but not limitative example of "first silicon oxide film" in one embodiment of the present disclosure. Further, the silicon oxide films 130A and 130C of the present embodiment are each equivalent to a specific but not limitative example of "second silicon oxide film" in one embodiment of the present disclosure.

In the present embodiment, of the first gate insulating films 129 and the second gate insulating film 130, one or more of the silicon oxide films (the silicon oxide films 129B, 130A, and 130C) include an impurity element (an impurity element D). The impurity element D may be, for example, one or more of elements in Group 15 (such as P, As, Sb, and Bi) and elements in Group 17 such as fluorine (F) in a periodic table. The above-described silicon oxide films may be partially or entirely doped with the above-described impurity element D, by, for example, ion implantation. Alternatively, the above-described silicon oxide films may each be a phosphorus silicate glass (PSG) film or a boron phosphorus silicate glass (BPSG) film that includes the impurity element D and is deposited by a chemical vapor deposition (CVD) method (a heat CVD method, or a plasma-enhancement CVD method), for example. Further, doping with the impurity element D may be performed by, for example, so-called plasma ion-implantation. FIGS. 5A to 5D each schematically illustrate a region containing the impurity element D, in a laminated structure of the first gate insulating film 129 and the second gate insulating film 130.

Figure 5A:
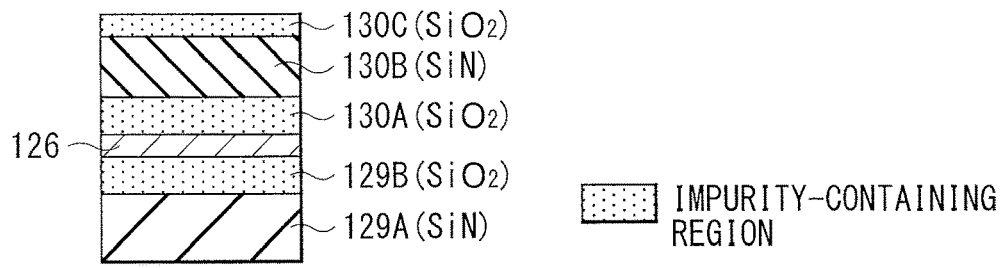
FIG. 5A is a schematic diagram illustrating an example of an impurity-containing region of a main part of the transistor illustrated in FIG. 4.
Figure 6A:
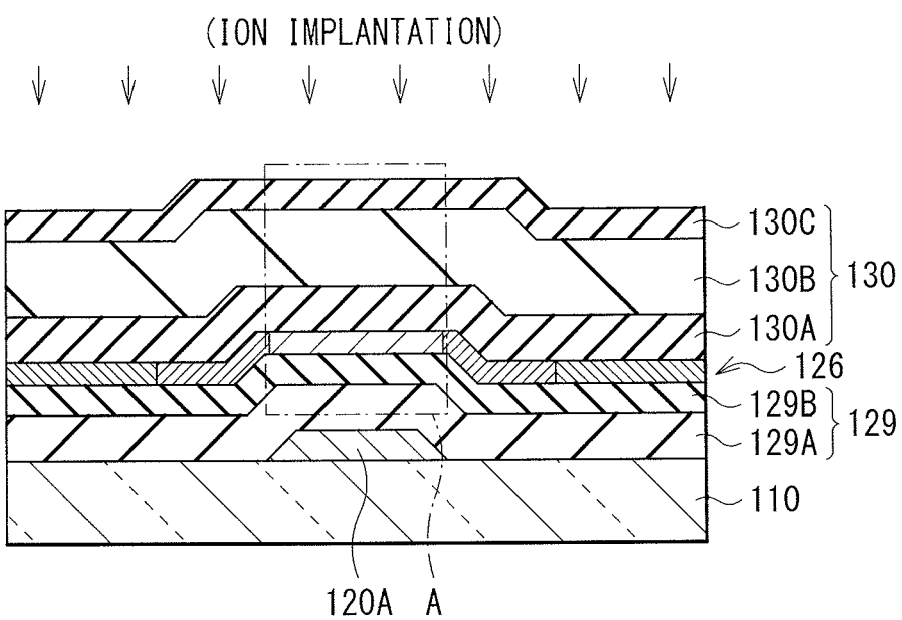
FIG. 6A is a schematic diagram used to describe an example of an impurity-element ion implantation process.

For example, as illustrated in FIG. 5A, the silicon oxide films 129B, 130A, and 130C may all include the impurity element D. In this case, for example, as illustrated in FIG. 6A, the first gate electrode 120A, the first gate insulating film 129, the semiconductor layer 126, and the second gate insulating film 130 are formed in this order on the substrate 110, and then doped with the impurity element D by ion implantation. In this process, an accelerating voltage is adjusted so that the impurity element D reaches the silicon oxide film 129B. It is to be noted that, in such ion implantation, actually, the impurity element D is implanted also in other films (such as the silicon nitride films 129A and 130B) included in the first gate insulating film 129 and the second gate insulating film 130. Even if the impurity element D is included in the silicon nitride films 129A and 130B, characteristics of the transistor 22 are not affected in particular. This also holds true for the following examples, and the silicon nitride films 129A and 130B may or may not include the impurity element D.

Alternatively, for example, the silicon oxide films 129B, 130A, and 130C including the impurity element D may each be formed as a PSG film or a BPSG film, by the CVD method. In this case, for example, in a process of forming each of the silicon oxide films 129B, 130A, and 130C, the impurity element D (for example, phosphorus) may be included when silicon dioxide ($SiO_2$) is deposited by the CVD method. It is to be noted that when the BPSG film is formed, a content of phosphorus may be preferably larger than a content of boron (B).

Figure 5B:
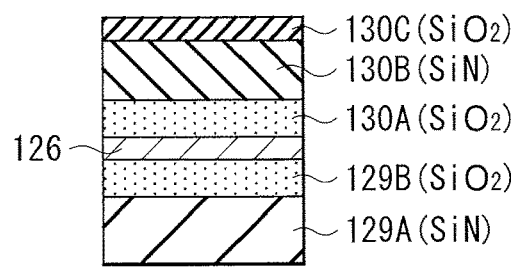
FIG. 5B is a schematic diagram illustrating another example of the impurity-containing region of the main part of the transistor illustrated in FIG. 4.

Still alternatively, as illustrated in FIG. 5B, the impurity element D may be included in the silicon oxide films 129B and 130A respectively adjacent to a bottom and a top of the semiconductor layer 126, while not being included in the silicon oxide film 130C. In this case as well, the silicon oxide films 129B and 130A including the impurity element D may be formed by, for example, the ion implantation, the CVD method, or the like. In particular, use of the CVD method makes it possible to dope only a target silicon oxide film (here, the silicon oxide films 129B and 130A) selectively with the impurity element D, which is effective.

Like the example in each of FIGS. 5A and 5B, the silicon oxide films 129B and 130A respectively adjacent to the bottom and the top of the semiconductor layer 126 may preferably include the impurity element D, which makes it possible to enhance X-ray resistance of the transistor, effectively. This is because, as will be described later in detail, a positive hole generated in the silicon oxide film (the silicon oxide films 129B and 130A) adjacent to the semiconductor layer 126 easily affects the threshold voltage.

Figure 5C:
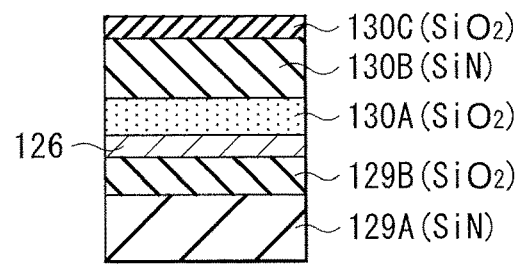
FIG. 5C is a schematic diagram illustrating still another example of the impurity-containing region of the main part of the transistor illustrated in FIG. 4.

Still alternatively, as illustrated in FIG. 5C, only the silicon oxide film 130A adjacent to the semiconductor layer 126 on an upper side thereof may include the impurity element D. Here, a silicon oxide film including a plurality of layers may be preferably laminated immediately above the semiconductor layer 126, as the above-described silicon oxide film 130A, in order to enhance characteristics of the TFT. Specifically, in a manufacturing process, a silicon oxide film serving as a stopper film may be preferably formed at the time of doping the semiconductor layer 126 with the impurity. Subsequently, after patterning of the semiconductor layer 126, one more layer of a silicon oxide film may be preferably formed to cover an exposed side face of the semiconductor layer 126 and the above-described stopper film. In such a case, a thickness of the silicon oxide film 130A on the upper side of the semiconductor layer 126 tends to be larger than that of the silicon oxide film 129B on a lower side of the semiconductor layer 126. Therefore, it is possible to suppress a shift in threshold voltage effectively, by selectively doping the silicon oxide film 130A on the upper side with the impurity element D.

Figure 5D:
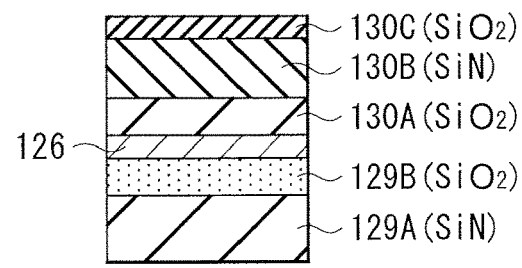
FIG. 5D is a schematic diagram illustrating yet another example of the impurity-containing region of the main part of the transistor illustrated in FIG. 4.
Figure 6B:
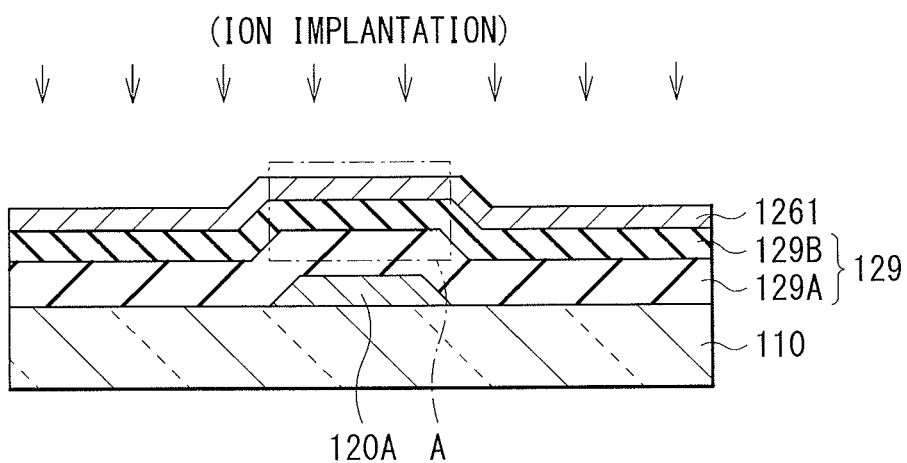
FIG. 6B is a schematic diagram used to describe another example of the impurity-element ion implantation process.

Further, as illustrated in FIG. 5D, only the silicon oxide film 129B adjacent to the semiconductor layer 126 on the lower side thereof may include the impurity element D. In this case, when doping with the impurity element D by the ion implantation is performed, for example, at first, the first gate electrode 120A, the first gate insulating film 129, and an amorphous silicon layer may be formed in this order on the substrate 110. Subsequently, the amorphous silicon layer may be crystallized by excimer laser annealing (ELA), to form a polysilicon layer 1261. Next, as illustrated in FIG. 6B, the ion implantation is performed by adjusting an accelerating voltage, so that the silicon oxide film 129B is doped with the impurity element D that has passed through the polysilicon layer 1261. It is to be noted that, afterwards, a process such as a process of patterning the polysilicon layer 1261 is performed to form the semiconductor layer 126.

It is to be noted that timing and techniques of doping with the impurity element D are not limited to those described above. It is only necessary to select a process of including the impurity element D in at least one of the silicon oxide films of the first gate insulating film 129 and the second gate insulating film 130.

The doping may be performed so that the above-described impurity element D is provided uniformly, or provided in a local region, in an in-plane direction of the silicon oxide film (concentration distribution may be present). In other words, of the semiconductor layer 126, only a selective region (a region A in FIGS. 6A and 6B) facing the channel layer 126a may be doped with the impurity element D. This is because, in particular, a positive hole generated in proximity to the channel layer 126a of the semiconductor layer 126 affects threshold-voltage characteristics.

Further, the transistor 22 is formed not only in the pixel section 11, but also in a peripheral circuit section (such as the row scanning section 13). The doping may be performed so that the impurity element D is provided all over the pixel section 11 and the peripheral circuit section, or provided selectively in only the pixel section 11 (only the transistor 22 formed in the pixel section 11 may be doped with the impurity element D). This is because, in the peripheral circuit section, the radiation Rrad such as X-rays is often shielded, and radiation resistance is less necessary than that in the pixel section 11.

In addition, a dosage of the impurity element D may be, for example, $1.0 \times 10^{11}$ atoms/cm$^2$ or more, and $1.0 \times 10^{13}$ atoms/cm$^2$ or less.

The interlayer insulating film 131 may be, for example, a single layer film made of any of silicon oxide, silicon oxynitride, and silicon nitride, or a laminated film including two or more of these. For example, the interlayer insulating film 131 may be a layer in which a silicon oxide film 131A, a silicon nitride film 131B, and a silicon oxide film 131C are laminated in this order from the second gate electrode 120B side. It is to be noted that another interlayer insulating film may be further formed to cover the interlayer insulating film 131 and the source-drain electrodes 128.

(Row Scanning Section 13)

The row scanning section 13 includes a shift register circuit to be described later, a predetermined logical circuit, etc. The row scanning section 13 is a pixel driving section (a row scanning circuit) that performs driving (line-sequential scanning) of the plurality of pixels 20 in the pixel section 11 row by row (by a horizontal line unit). Specifically, the row scanning section 13 may perform image pickup operation such as reading operation and reset operation of each of the pixels 20 by, for example, line-sequential scanning. It is to be noted that, this line-sequential scanning is performed by supplying the above-described row scanning signal to each of the pixels 20 through the readout control line Lread.

(A/D Conversion Section 14)

The A/D conversion section 14 includes a plurality of column selection sections 17 each provided for each plurality of (here, four) signal lines Lsig. The A/D conversion section 14 performs A/D conversion (analog-to-digital conversion) based on a signal voltage (a voltage corresponding to the signal charge) inputted through the signal line Lsig. As a result, output data Dout (an image pickup signal) that is a digital signal is generated and then outputted to outside.

Figure 7:
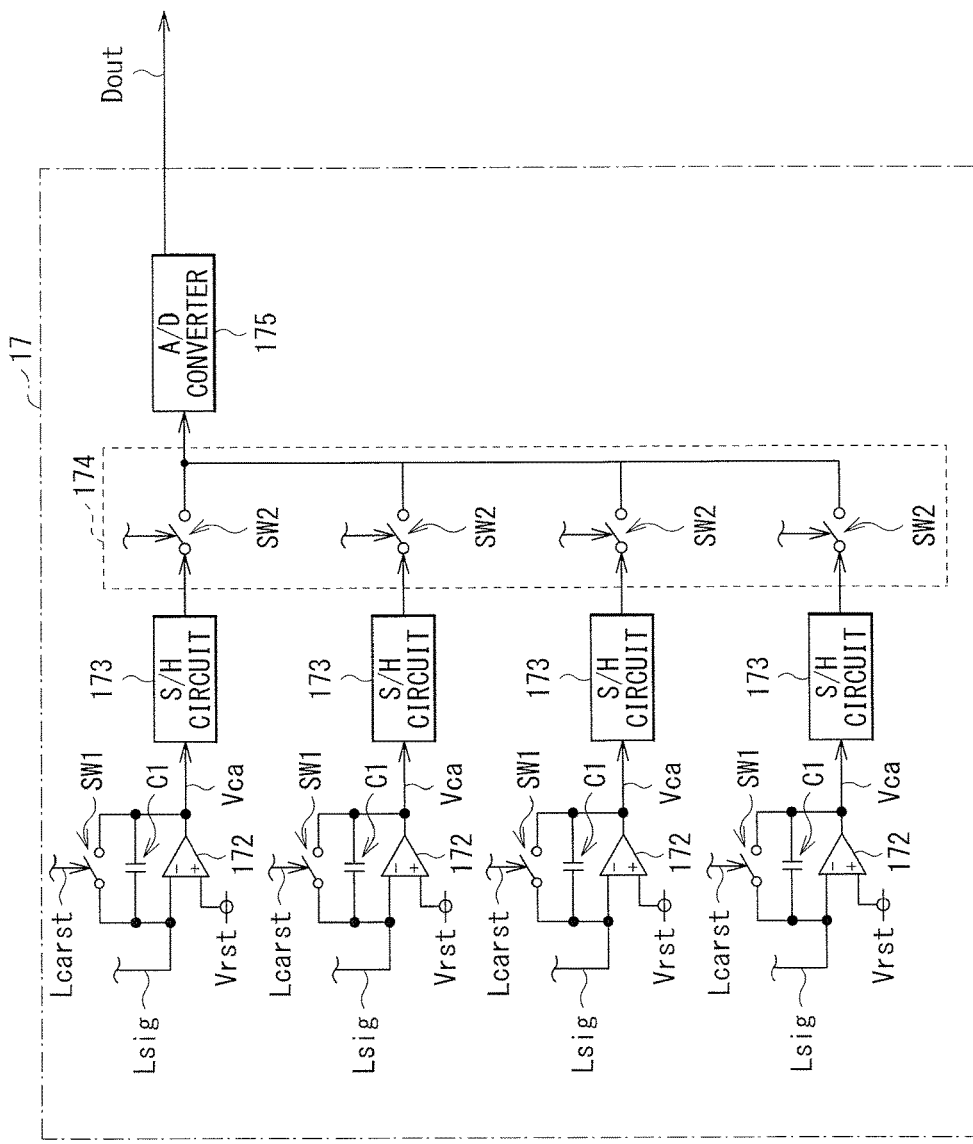
FIG. 7 is a block diagram illustrating a detailed configuration example of a column selection section illustrated in FIG. 1.

For example, as illustrated in FIG. 7, each of the column selection sections 17 may include a charge amplifier 172, a capacitive element (a capacitor, a feedback capacitor, or the like) C1, a switch SW1, a sample hold (S/H) circuit 173, a multiplexor circuit (a selection circuit) 174 including four switches SW2, and an A/D converter 175. Of these components, the charge amplifier 172, the capacitive element C1, the switch SW1, the S/H circuit 173, and the switch SW2 are provided for each of the signal lines Lsig. The multiplexor circuit 174 and the A/D converter 175 are provided for each of the column selection sections 17. It is to be noted that the charge amplifier 172, the capacitive element C1, and the switch SW1 form the charge amplifier circuit 171 in FIG. 3.

The charge amplifier 172 is an amplifier provided to perform conversion (Q-V conversion) in which the signal charge read out from the signal line Lsig is converted to a voltage. In the charge amplifier 172, one end of the signal line Lsig is connected to an input terminal on a negative side (− side), and a predetermined reset voltage Vrst is inputted to an input terminal on a positive side (+ side). Between an output terminal and the input terminal on the negative side of the charge amplifier 172, feedback connection is established through a parallel connection circuit between the capacitive element C1 and the switch SW1. In other words, one terminal of the capacitive element C1 is connected to the input terminal on the negative side of the charge amplifier 172, and the other terminal is connected to the output terminal of the charge amplifier 172. Similarly, one terminal of the switch SW1 is connected to the input terminal on the negative side of the charge amplifier 172, and the other terminal is connected to the output terminal of the charge amplifier 172. It is to be noted that an ON/OFF state of the switch SW1 is controlled by a control signal (an amplifier reset control signal) supplied from the system control section 16 through an amplifier reset control line Lcarst.

The S/H circuit 173 is disposed between the charge amplifier 172 and the multiplexor circuit 174 (the switch SW2), and is a circuit provided to hold an output voltage Vca from the charge amplifier 172 temporarily.

The multiplexor circuit 174 is a circuit that selectively makes or breaks connection between each of the S/H circuits 173 and the A/D converter 175, when one of the four switches SW2 is sequentially brought to an ON state according to scanning driving by the column scanning section 15.

The A/D converter 175 is a circuit that performs A/D conversion of the output voltage inputted from the S/H circuit 173 through the switch SW2, thereby generating the above-described output data Dout, and outputs the generated output data Dout.

(Column Scanning Section 15)

The column scanning section 15 may include, for example, a shift register, an address decoder, etc. not illustrated, and sequentially drives each of the above-described switches SW2 in the column selection section 17 while scanning each of the switches SW2. By such selective scanning performed by the column scanning section 15, the signal (the above-described output data Dout) of each of the pixels 20 read out through each of the signal lines Lsig is sequentially outputted to the outside.

(System Control Section 16)

The system control section 16 controls each operation of the row scanning section 13, the A/D conversion section 14, and the column scanning section 15. Specifically, the system control section 16 includes a timing generator that generates the above-described various timing signals (control signals). Based on these various timing signals generated by the timing generator, the system control section 16 performs control of driving the row scanning section 13, the A/D conversion section 14, and the column scanning section 15. Based on this control of the system control section 16, each of the row scanning section 13, the A/D conversion section 14, and the column scanning section 15 performs image-pickup driving (line-sequential image-pickup driving) for the plurality of pixels 20 in the pixel section 11, so that the output data Dout is obtained from the pixel section 11.

[Functions and Effects]

In the radiation image-pickup device 1 of the present embodiment, for example, when the radiation Rrad such as X-rays enters the pixel section 11, signal charge based on the entering light may be generated in each of the pixels 20 (here, the photoelectric conversion element 21). At this moment, specifically, in the storage node N illustrated in FIG. 3, a voltage variation corresponding to node capacity occurs due to storage of the generated signal charge. As a result, the input voltage Vin (a voltage corresponding to the signal charge) is supplied to the drain of the transistor 22. Subsequently, when the transistor 22 changes to the ON in response to the row scanning signal supplied through the readout control line Lread, the above-described signal charge is read out to the signal line Lsig.

The signal charge read out is inputted to the column selection section 17 in the A/D conversion section 14, for each plurality of (here, four) pixel columns, through the signal line Lsig. In the column selection section 17, at first, the Q-V conversion (conversion from signal charge to a signal voltage) is performed in the charge amplifier circuit 171 including the charge amplifier 172 and the like, for each signal charge inputted through each of the signal lines Lsig. Next, for each of the signal voltages after the Q-V conversion (an output voltage Vca from the charge amplifier 172), the A/D conversion is performed in the A/D converter 175 through the S/H circuit 173 and the multiplexor circuit 174. Then, the output data Dout (the image pickup signal) that is a digital signal is generated. In this way, the output data Dout is sequentially outputted from each of the column selection sections 17, and then transmitted to the outside (or inputted to an internal memory not illustrated).

Here, a part of the radiation Rrad that has entered the radiation image-pickup device 1 may not be absorbed by the wavelength conversion layer 112 (or the direct conversion layer 111B) described above, and leak into a layer below the wavelength conversion layer 112. When such radiation enters the transistor 22, malfunctions occur as follows. The transistor 22 includes the silicon oxide films (the silicon oxide films 129B and 130A) in the first gate insulating film 129 and the second gate insulating film 130. When radiation enters these silicon oxide films, electrons in the films are excited by, so-called, a photoelectric effect, Compton diffusion, or electron pair production. As a result, positive holes are trapped and accumulated in the first gate insulating film 129 and the second gate insulating film 130, and are also trapped and accumulated at an interface with the channel layer 126a. Therefore, for example, a threshold voltage Vth of the transistor 22 may shift to a negative side (a minus side), and an S (threshold) value may deteriorate. In other words, an increase in off-state current, a decrease in on-state current, or the like may result.

Figure 8:
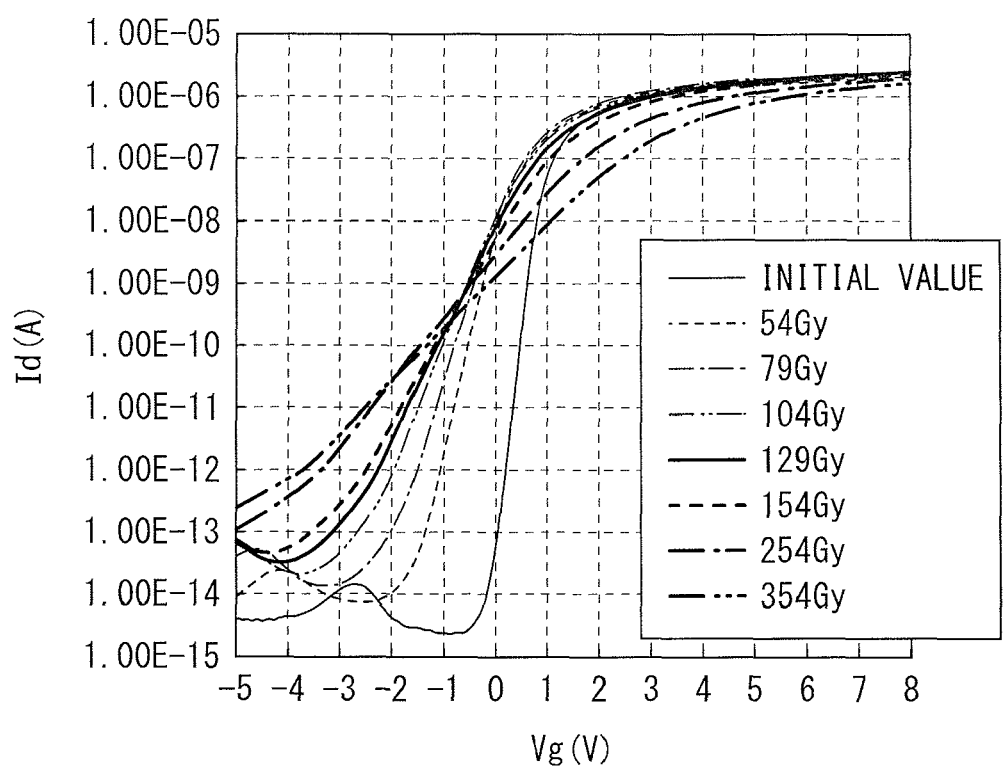
FIG. 8 is a characteristic diagram used to describe an influence of X-rays on current-voltage characteristics of the transistor.

FIG. 8 illustrates a relationship (current-voltage characteristics) between a drain current Id (a current between the source and the drain) and a gate voltage Vg of the transistor 22, for each X-ray irradiation dose. Irradiation conditions are a tube voltage of 80 kV and a dose rate of 3.2 mGy/second. FIG. 8 illustrates the characteristics when an irradiation dose is each of 0 Gy (an initial value), 54 Gy, 79 Gy, 104 Gy, 129 Gy, 154 Gy, 254 Gy, and 354 Gy. It is to be noted that the low temperature poly-silicon is used for the semiconductor layer 126, and a voltage Vds between the source and the drain is 0.1 V. It is found that, as the X-ray irradiation dose increases, the threshold voltage Vth (for example, the gate voltage Vg, where $Id=1.0\times10^{-13}$ A) shifts to a negative side further, and the S value deteriorates.

In the present embodiment, one or more of the silicon oxide films of the first gate insulating film 129 and the second gate insulating film 130 include the impurity element D, in the transistor 22. Specifically, one or more of the silicon oxide films 129B, 130A, and 130C may be doped with, for example, the element(s) in Group 15 such as phosphorus. This allows electrical neutralization, even when the positive hole is generated in the film by the entrance of radiation as described above. Therefore, electrical influence on the transistor 22 due to the generated positive hole is reduced, which makes it possible to suppress the above-described consequences such as the shift in the threshold voltage.

In addition, the impurity element D may be included in the silicon oxide films 129B and 130A respectively adjacent to the bottom and the top of the semiconductor layer 126. This allows a reduction in influence of a positive hole at a part in proximity to the interface with the semiconductor layer 126. Therefore, it is possible to suppress the above-described threshold shift more effectively.

As described above, in the present embodiment, the transistor 22 includes the first gate electrode 120A, the first gate insulating film 129 (including the silicon oxide film 129B), the semiconductor layer 126, the second gate insulating film 130 (including the silicon oxide films 130A and 130C), and the second gate electrode 120B, in this order from the substrate 110 side. The transistor 22 is used to read the signal charge based on the radiation Rrad from each of the pixels 20. Since one or more of the silicon oxide films 129A, 130A, and 130C include the impurity element D, it is possible to suppress characteristic deterioration of the transistor attributable to the entrance of radiation. Therefore, an improvement in a transistor element life is allowed.

Next, modifications of the above-described embodiment will be described. It is to be noted that the same components as those of the above-described embodiment will be provided with the same reference numerals as those thereof, and the description will be omitted as appropriate.

[Modification 1]

Figure 9:
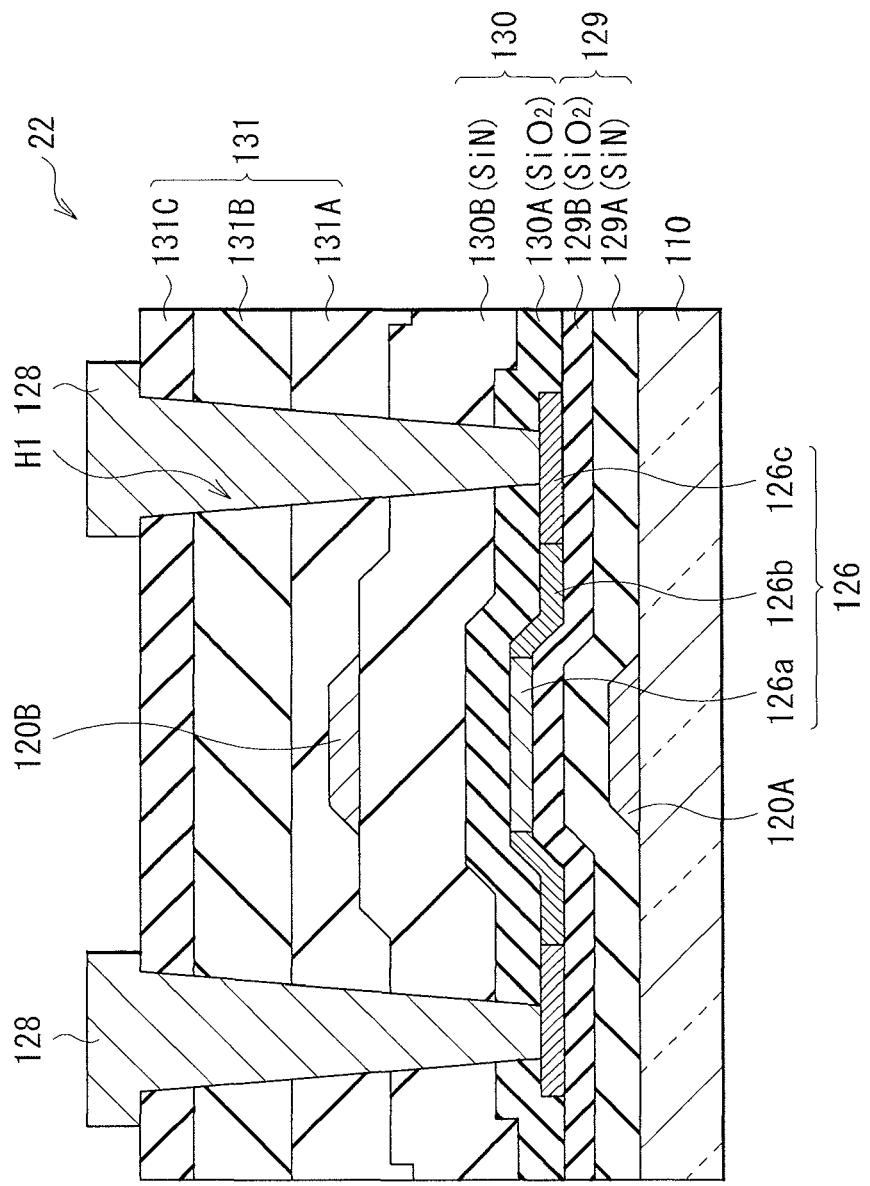
FIG. 9 is a cross-sectional diagram illustrating a configuration of a transistor according to Modification 1.

FIG. 9 illustrates a cross-sectional configuration of a transistor according to Modification 1. In the above-described embodiment (the example in FIG. 4), the second gate insulating film 130 has a three-layer structure in which the silicon oxide film 130A, the silicon nitride film 130B, and the silicon oxide film 130C are laminated in this order from the semiconductor layer 126 side. However, the laminated structure of the second gate insulating film 130 is not limited to this structure. For example, the second gate insulating film 130 may have a two-layer structure in which the silicon oxide film 130A and the silicon nitride film 130B are laminated in this order from the semiconductor layer 126 side, as in the present modification.

In addition, although not illustrated, the second gate insulating film 130 may be a single layer film made of the silicon oxide film 130A. At least one layer of a silicon oxide film may only be formed, on the second gate electrode 120B side of the semiconductor layer 126.

[Modification 2]

Figure 10:
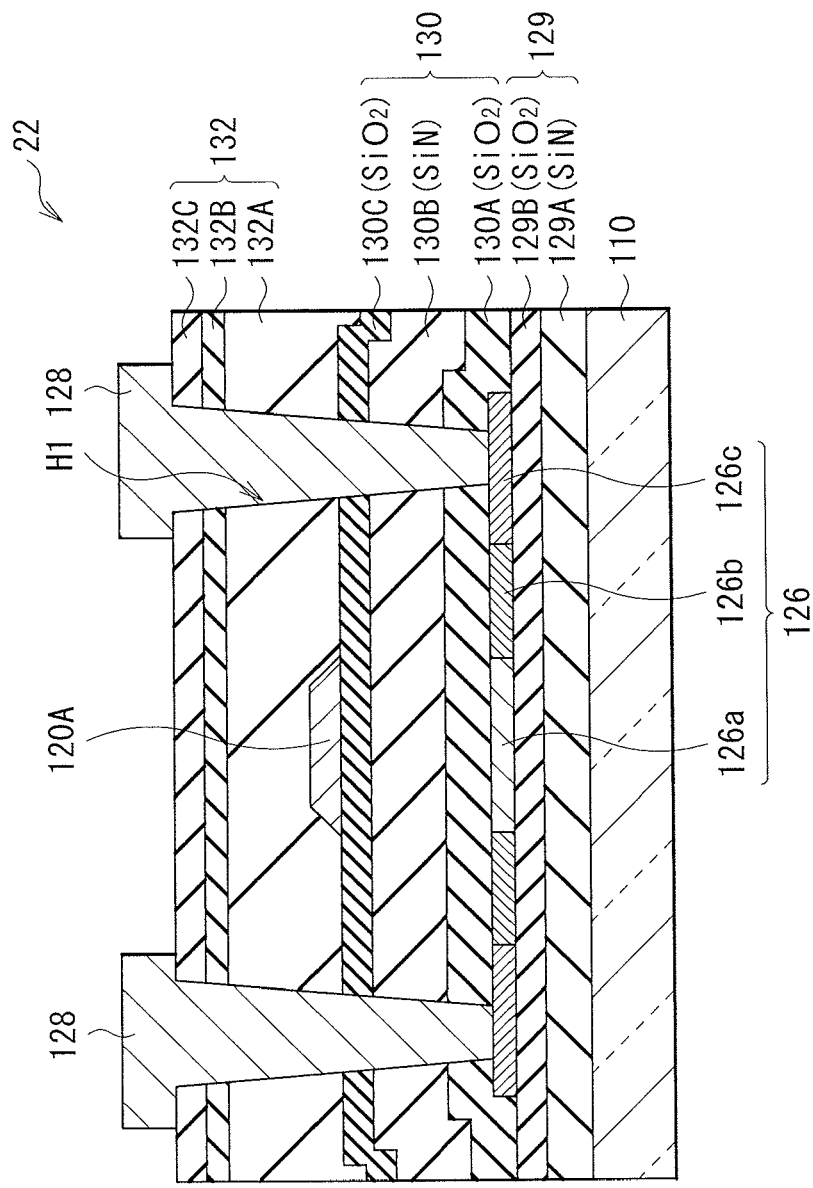
FIG. 10 is a cross-sectional diagram illustrating a configuration of a transistor according to Modification 2.

FIG. 10 illustrates a cross-sectional configuration of a transistor according to Modification 2. In the above-described embodiment, the dual-gate-type structure has been taken as an example. However, the transistor in one embodiment of the present disclosure may have a so-called top-gate-type element structure, as in the present modification. The element structure of the present modification may include, for example, the first gate insulating film 129, the semiconductor layer 126, the second gate insulating film 130, and the first gate electrode 120A in this order from the substrate 110 side. In addition, an interlayer insulating film 132 is formed on the second gate insulating film 130 and the first gate electrode 120A, and the contact hole H1 passing through the interlayer insulating film 132 and the second gate insulating film 130 is formed. The source-drain electrode 128 is formed on the interlayer insulating film 132, to fill the contact hole H1. The interlayer insulating film 132 is a laminated film that may include, for example, a silicon oxide film 132A, a silicon nitride film 132B, and a silicon oxide film 132C in this order from the silicon oxide film 130A side.

In the present modification, likewise, one or more of the silicon oxide films 129B, 130A, and 130C include the impurity element D and therefore, it is possible to obtain effects similar to those of the above-described embodiment. In addition, in the present modification, the silicon oxide film (the silicon oxide films 130A and 130C) of the insulating film (the second gate insulating film 130) formed between the first gate electrode 120A and the semiconductor layer 126 may be preferably doped with the impurity element D. This is to allow effective suppression of the above-described shift in the threshold voltage.

It is to be noted that, in the present modification as well, the laminated structure of the second gate insulating film 130 is not limited to that described above, if a silicon oxide film is included. The laminated structure of the second gate insulating film 130 may have a two-layer structure, or may be a single layer film of silicon oxide.

[Modification 3]

Figure 11:
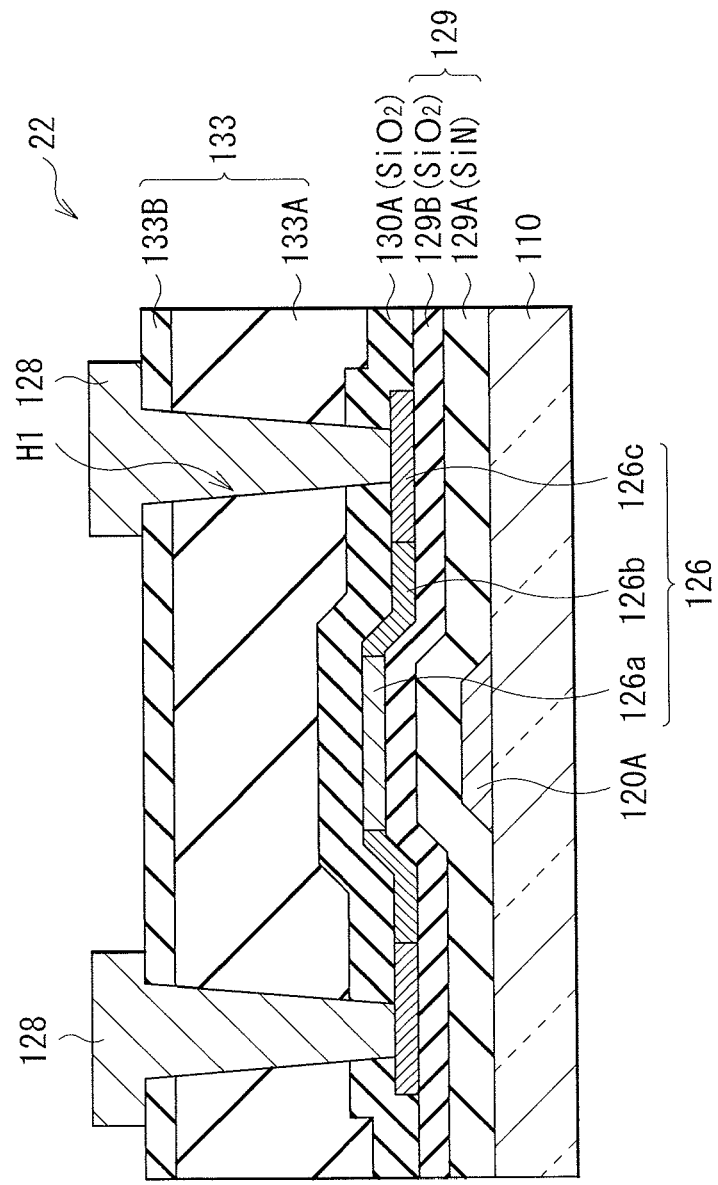
FIG. 11 is a cross-sectional diagram illustrating a configuration of a transistor according to Modification 3.

FIG. 11 illustrates a cross-sectional configuration of a transistor according to Modification 3. In the above-described embodiment, the dual-gate-type element structure has been taken as an example. However, the transistor according to an embodiment of the present disclosure may have a so-called bottom-gate-type element structure, as in the present modification. The element structure of the present modification may include, for example, the first gate electrode 120A, the first gate insulating film 129, the semiconductor layer 126, and the silicon oxide film 130A in this order from the substrate 110 side. Further, an interlayer insulating film 133 is formed on the silicon oxide film 130A, and the contact hole H1 passing through the interlayer insulating film 133 and the silicon oxide film 130A is formed. On the interlayer insulating film 133, the source-drain electrode 128 is provided to fill the contact hole H1. The interlayer insulating film 133 is a laminated film that may include, for example, a silicon nitride film 133A and a silicon oxide film 133B in this order from the silicon oxide film 130A side.

In the present modification, likewise, one or both of the silicon oxide films 129B and 130A include the impurity element D and therefore, it is possible to obtain effects similar to those of the above-described embodiment. In addition, in the present modification, the silicon oxide film (the silicon oxide film 129B) of the gate insulating film (the first gate insulating film 129) formed between the first gate electrode 120A and the semiconductor layer 126 may be preferably doped with the impurity element D. This is to allow effective suppression of the above-described shift in the threshold voltage.

[Modification 4]

Figure 12:
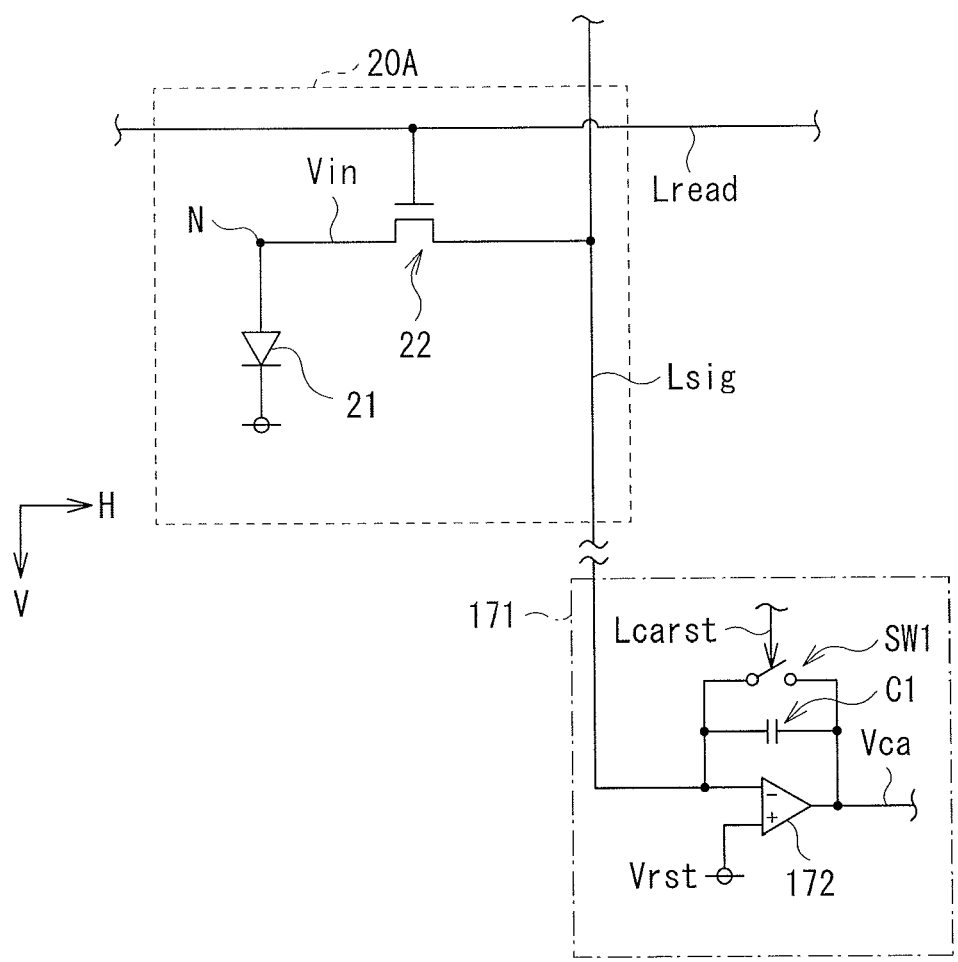
FIG. 12 is a circuit diagram illustrating a configuration of components including a pixel according to Modification 4.

FIG. 12 illustrates a circuit configuration of a pixel (a pixel 20A) according to Modification 4, together with a circuit configuration example of the charge amplifier circuit 171 of the above-described embodiment. The pixel 20A of the present modification has a so-called passive circuit configuration as with the pixel 20 of the above-described embodiment, and includes the one photoelectric conversion element 21 and the one transistor 22. Further, the readout control line Lread extending in the H direction and the signal line Lsig extending in the V direction are connected to the pixel 20A.

However, in the pixel 20A of the present modification, unlike the pixel 20 of the above-described embodiment, an anode of the photoelectric conversion element 21 is connected to the storage node N and a cathode is connected to ground (grounded). In this way, in the pixel 20A, the storage node N may be connected to the anode of the photoelectric conversion element 21, and in such a configuration as well, it is possible to obtain effects similar to those of the radiation image-pickup device 1 of the above-described embodiment.

[Modification 5]

Figure 13:
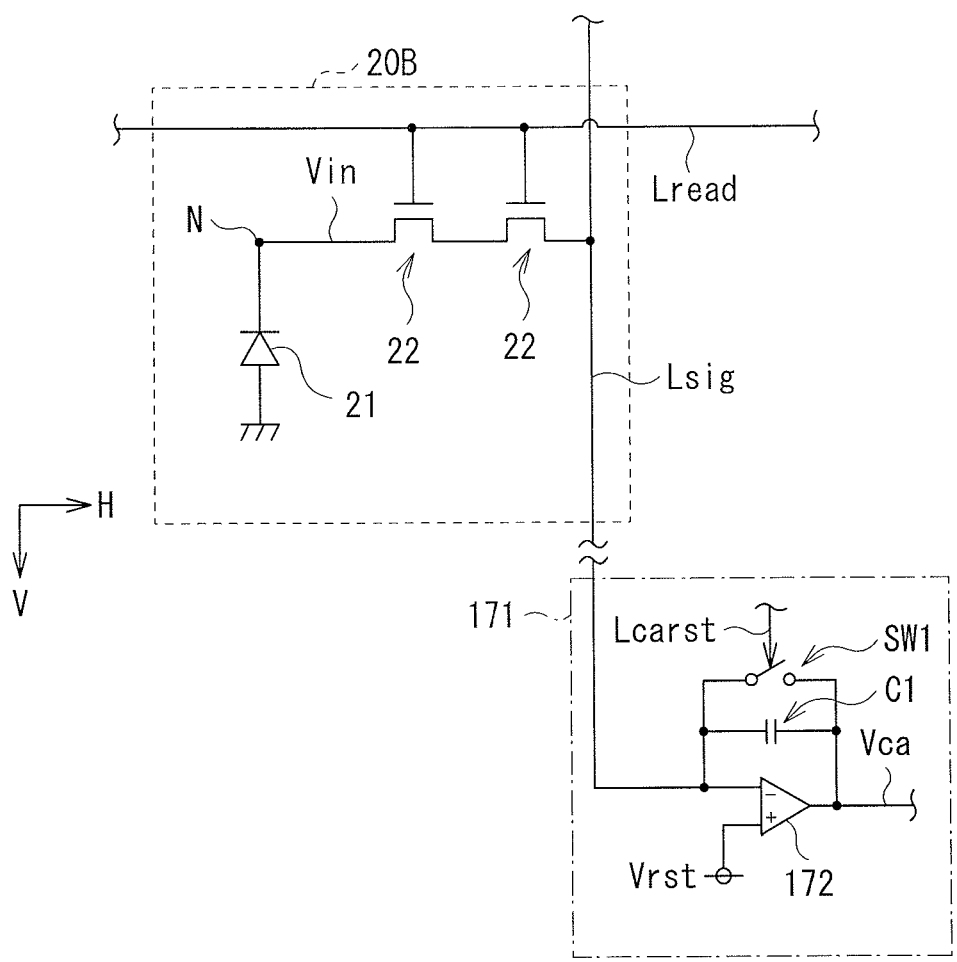
FIG. 13 is a circuit diagram illustrating a configuration of components including a pixel according to Modification 5.

FIG. 13 illustrates a circuit configuration of a pixel (a pixel 20B) according to Modification 5, together with a circuit configuration example of the charge amplifier circuit 171 of the above-described embodiment. The pixel 20B of the present modification has a so-called passive circuit configuration as with the pixel 20 of the above-described embodiment, and includes the one photoelectric conversion element 21. Further, the readout control line Lread extending in the H direction and the signal line Lsig extending in the V direction are connected to the pixel 20B.

However, in the present modification, the pixel 20B includes two transistors 22. These two transistors 22 are connected to each other in series (a source or a drain of one of these transistors is electrically connected to a source or a drain of the other). It is possible to reduce off leak, by thus providing the two transistors 22 in the one pixel 20B.

In this way, the two transistors 22 connected in series may be provided in the pixel 20B, and in this case as well, it is possible to obtain effects similar to those of the above-described embodiment. It is to be noted that three or more transistors may be connected in series.

[Modifications 6-1 and 6-2]

Figure 14:
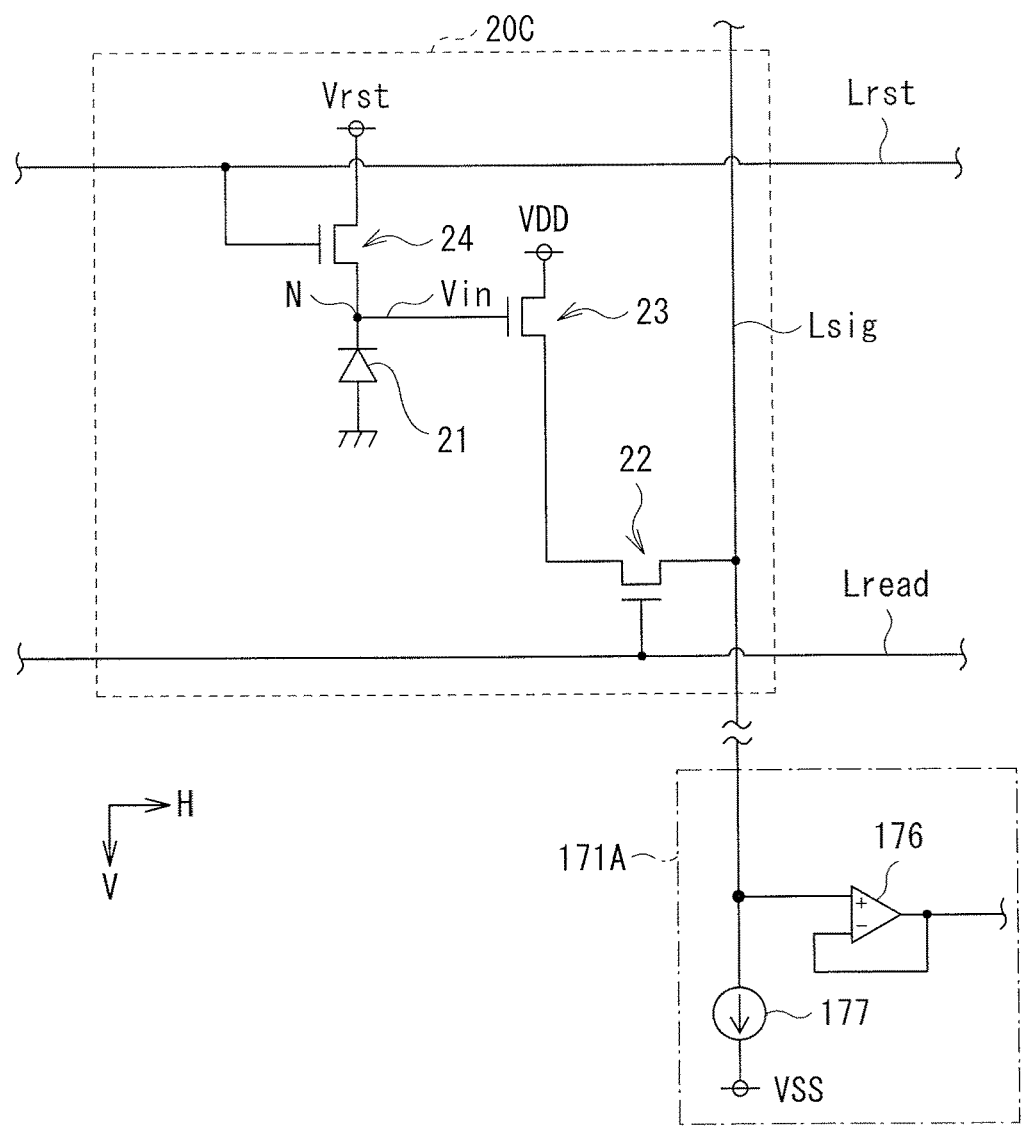
FIG. 14 is a circuit diagram illustrating a configuration of components including a pixel according to Modification 6-1.
Figure 15:
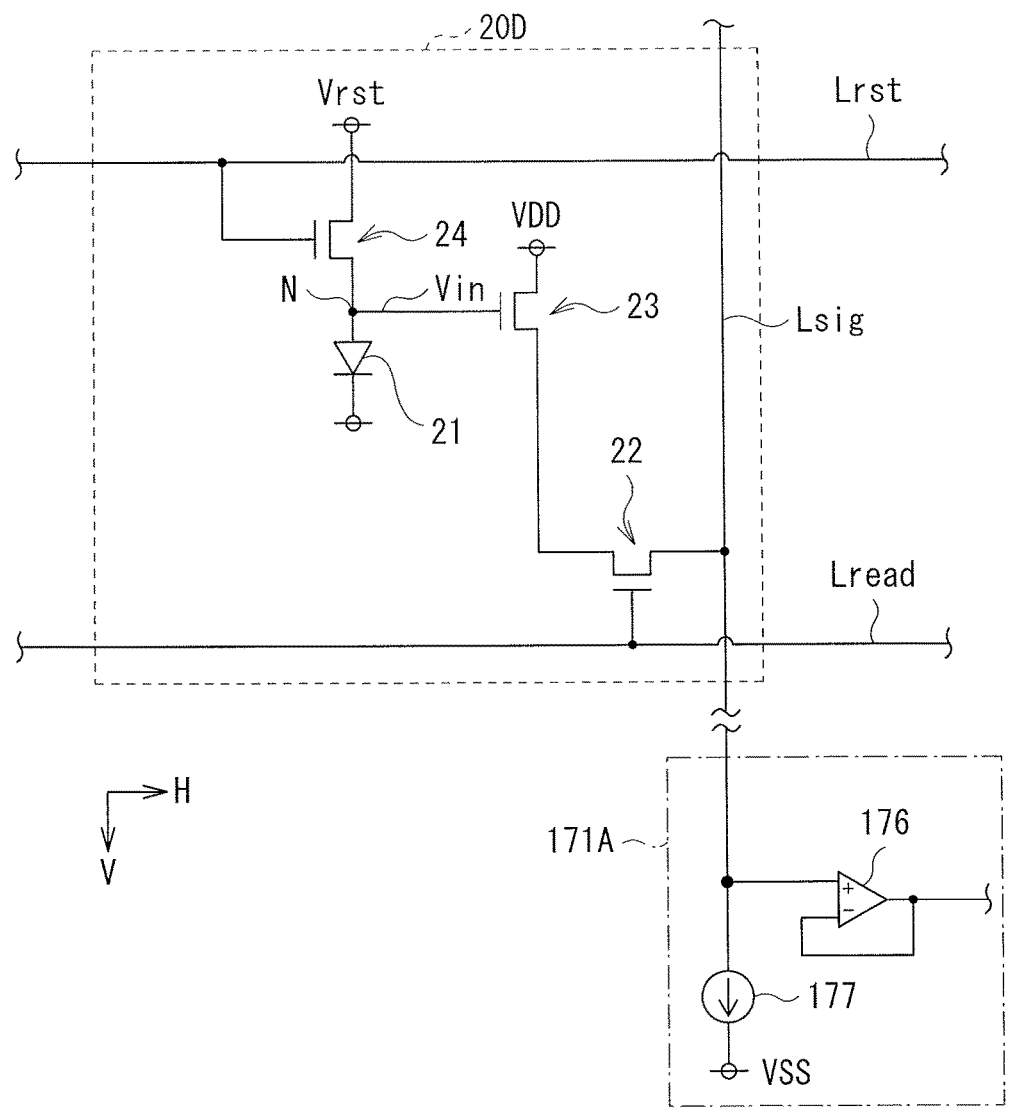
FIG. 15 is a circuit diagram illustrating a configuration of components including a pixel according to Modification 6-2.

FIG. 14 illustrates a circuit configuration of a pixel (a pixel 20C) according to Modification 6-1, together with a circuit configuration example of a charge amplifier circuit 171A that will be described below. Further, FIG. 15 illustrates a circuit configuration of a pixel (a pixel 20D) according to Modification 6-2, together with a circuit configuration example of the charge amplifier circuit 171A. The pixels 20C and 20D according to these Modifications 6-1 and 6-2 each include a so-called active pixel circuit, unlike the above-described pixels 20, 20A, and 20B.

The active pixels 20C and 20D are each provided with the one photoelectric conversion element 21, and three transistors 22, 23, and 24. Further, to each of the pixels 20C and 20D, the readout control line Lread as well as a reset control line Lrst extending in the H direction, and the signal line Lsig extending in the V direction are connected.

In each of the pixels 20C and 20D, a gate of the transistor 22B is connected to the readout control line Lread, a source thereof is connected to the signal line Lsig, and a drain thereof is connected to a drain of the transistor 23 included in a source follower circuit. Of the transistor 23, a source is connected to a power supply VDD, and a gate is connected to a cathode (in the example of FIG. 14) or an anode (in the example of FIG. 15) of the photoelectric conversion element 21 and to a drain of the transistor 24 serving as a reset transistor, through the storage node N. A gate of the transistor 24 is connected to the reset control line Lrst, and the reset voltage Vrst is applied to a source thereof. In Modification 6-1, the anode of the photoelectric conversion element 21 is connected to ground. In Modification 6-2, the cathode of the photoelectric conversion element 21 is connected to ground.

Further, in each of these Modifications 6-1 and 6-2, the charge amplifier circuit 171A includes an amplifier 176 and a constant current source 177, in place of the charge amplifier 172, the capacitive element C1, and the switch SW1 in the charge amplifier circuit 171 described earlier. In the amplifier 176, the signal line Lsig is connected to an input terminal on a positive side, an input terminal on a negative side and an output terminal are connected to each other, and a voltage follower circuit is formed. It is to be noted that, one terminal of the constant current source 177 is connected to one-end side of the signal line Lsig, and a power supply VSS is connected to the other terminal of the constant current source 177.

The above-described radiation image-pickup device of the indirect conversion type or the direct conversion type is utilized as any of various types of radiation image-pickup devices that obtain an electric signal based on the radiation Rrad. For example, the above-described radiation image-pickup device is applicable to devices including X-ray image pickup devices for medical care (such as Digital Radiography), X-ray image pickup devices for inspection of carried objects used at places such as airports, and X-ray image pickup devices for industrial use (for example, a device that inspects dangerous objects in containers).

Application Example

The radiation image-pickup device according to any of the above-described embodiment and the like is applicable to a radiation image-pickup display, as will be described below.

Figure 16:
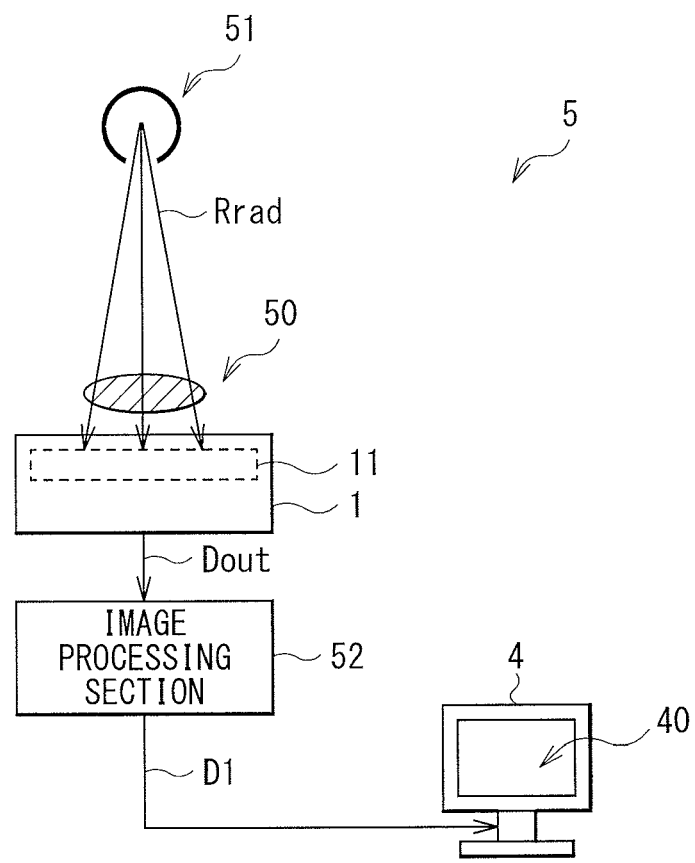
FIG. 16 is a schematic diagram illustrating a schematic configuration of an image pickup display system according to an application example.

FIG. 16 schematically illustrates a schematic configuration example of a radiation image-pickup display system (a radiation image-pickup display system 5) according to an application example. The radiation image-pickup display system 5 includes the radiation image-pickup device 1 including the pixel section 11 and the like according to any of the above-described embodiment and the like. The radiation image-pickup display system 5 further includes an image processing section 52, and a display 4.

The image processing section 52 generates image data D1, by performing predetermined image processing on the output data Dout (the image pickup signal) outputted from the radiation image-pickup device 1. Based on the image data D1 generated in the image processing section 52, the display 4 displays an image on a predetermined monitor screen 40.

In the radiation image-pickup display system 5, based on radiation emitted towards a subject 50 from a radiation source 51 such as an X-ray source, the radiation image-pickup device 1 obtains image data Dout of the subject 50, and outputs the obtained image data Dout to the image processing section 52. The image processing section 52 performs the above-described predetermined image processing on the inputted image data Dout, and outputs the image data (display data) D1 after the image processing, to the display 4. The display 4 displays image information (a picked-up image) on the monitor screen 40 based on the inputted image data D1.

In this way, in the radiation image-pickup display system 5 of the present application example, the radiation image-pickup device 1 is allowed to obtain an image of the subject 50 as an electric signal. Therefore, it is possible to display the image by transmitting the obtained electric signal to the display 4. In other words, it is possible to observe an image of the subject 50 without using a radiographic film. In addition, it is also possible to support moving-image taking and moving-image display.

Some embodiment, modifications, and application example have been described above, but the contents of the present disclosure are not limited thereto, and may be variously modified. For example, in the above-described embodiment and the like, a lamination including one to three insulating films has been taken as an example of each of the first and the second gate insulating films. However, the first and the second gate insulating films may each be a lamination including four or more insulating films. As long as the first and the second silicon oxide films are provided with the semiconductor layer interposed therebetween, and the first or the second silicon oxide film or both include the impurity element D, any types of laminated structures allow effects similar to those of the embodiment and the like of the present disclosure to be obtained.

Further, the circuit configuration of the pixel in the pixel section of each of the above-described embodiment and the like is not limited to those (the circuit configuration of each of the pixels 20, and 20A to 20D) described above, and may be other circuit configuration. Similarly, the circuit configuration of each of other components such as the row scanning section and the column selection section is not limited to those of the above-described embodiment and the like, and may be other circuit configuration.

Furthermore, the pixel section, the row scanning section, the A/D conversion section (the column selection section), the column scanning section, and the like of each of the above-described embodiment and the like may be formed, for example, on the same substrate. Specifically, for example, using a polycrystalline semiconductor such as low temperature poly-silicon, the switch and the like in these circuit portions may also be formed on the same substrate. Therefore, for example, driving operation on the same substrate may be performed based on a control signal from an external system control section, which allows achievement of a slim bezel (a frame structure in which three sides are free) and an improvement in reliability in wiring connection.

It is possible to achieve at least the following configurations from the above-described example embodiments of the disclosure.

(1) A radiation image-pickup device including:
a plurality of pixels configured to generate signal charge based on radiation; and
a field effect transistor used to read out the signal charge from the plurality of pixels,
wherein the transistor includes
a first silicon oxide film, a semiconductor layer, and a second silicon oxide film laminated in order from a substrate side, the semiconductor layer including an active layer, and
a first gate electrode disposed to face the semiconductor layer, with the first or the second silicon oxide film interposed therebetween, and
the first or the second silicon oxide film or both include an impurity element.

(2) The radiation image-pickup device according to (1), wherein
the transistor includes the first gate electrode, the first silicon oxide film, the semiconductor layer, and the second silicon oxide film in order from the substrate side, and
the transistor further includes a second gate electrode on the second silicon oxide film, to face the first gate electrode.

(3) The radiation image-pickup device according to (2), wherein
the first and the second silicon oxide films are disposed to be adjacent to the semiconductor layer, and
the first and the second silicon oxide films both include the impurity element.

(4) The radiation image-pickup device according to (2), wherein, of the first and the second silicon oxide films, only the second silicon oxide film includes the impurity element.

(5) The radiation image-pickup device according to (2), wherein, of the first and the second silicon oxide films, only the first silicon oxide film includes the impurity element.

(6) The radiation image-pickup device according to any one of (1) to (5), wherein the impurity element is provided in a selective region facing a channel part of the semiconductor layer, by doping.

(7) The radiation image-pickup device according to any one of (1) to (6), wherein, of a pixel section including the plurality of pixels, and a peripheral circuit section peripheral to the pixel section, only the pixel section is doped with the impurity element.

(8) The radiation image-pickup device according to any one of (1) to (7), wherein the impurity element is one or more of elements in Group 15 and fluorine (F).

(9) The radiation image-pickup device according to any one of (1) to (7), wherein the first or the second silicon oxide film or both are a phosphorus silicate glass (PSG) film or a boron phosphorus silicate glass (BPSG) film that includes phosphorus (P) as the impurity element.

(10) The radiation image-pickup device according to any one of (1) to (9), wherein a dosage of the impurity element is about $1.0 \times 10^{11}$ atoms per square centimeter or more, and about $1.0 \times 10^{13}$ atoms per square centimeter or less.

(11) The radiation image-pickup device according to (1), wherein the transistor includes the first silicon oxide film, the semiconductor layer, the second silicon oxide film, and the first gate electrode in order from the substrate side.

(12) The radiation image-pickup device according to (11), wherein, of the first and the second silicon oxide films, at least the second silicon oxide film includes the impurity element.

(13) The radiation image-pickup device according to (1), wherein the transistor includes the first gate electrode, the first silicon oxide film, the semiconductor layer, and the second silicon oxide film in order from the substrate side.

(14) The radiation image-pickup device according to (13), wherein, of the first and the second silicon oxide films, at least the first silicon oxide film includes the impurity element.

(15) The radiation image-pickup device according to any one of (1) to (14), wherein the semiconductor layer includes polycrystal silicon, micro-crystal silicon, amorphous silicon, or an oxide semiconductor.

(16) The radiation image-pickup device according to (15), wherein the semiconductor layer includes low temperature poly-silicon.

(17) The radiation image-pickup device according to any one of (1) to (16), further including a wavelength conversion layer,
wherein the plurality of pixels each include a photoelectric conversion element, and
the wavelength conversion layer is provided on a light incident side of the plurality of pixels, and configured to convert the radiation to a wavelength in a sensitivity range of the photoelectric conversion element.

(18) The radiation image-pickup device according to any one of (1) to (16), wherein the plurality of pixels each include a conversion layer configured to generate the signal charge by absorbing the radiation.

(19) The radiation image-pickup device according to any one of (1) to (18), wherein the radiation includes X-rays.

(20) A radiation image-pickup display system including:
a radiation image-pickup device; and
a display configured to perform image display based on an image pickup signal obtained by the radiation image-pickup device,
wherein the radiation image-pickup device includes
a plurality of pixels configured to generate signal charge based on radiation, and
a field effect transistor used to read out the signal charge from the plurality of pixels,
the transistor includes
a first silicon oxide film, a semiconductor layer, and a second silicon oxide film laminated in order from a substrate side, the semiconductor layer including an active layer, and
a first gate electrode disposed to face the semiconductor layer, with the first or the second silicon oxide film interposed therebetween, and
the first or the second silicon oxide film or both include an impurity element.

It should be understood by those skilled in the art that various modifications, combinations, sub-combinations, and alterations may occur depending on design requirements and other factors insofar as they are within the scope of the appended claims or the equivalents thereof.

What is claimed is:

1. A radiation image-pickup device comprising:
a plurality of pixels configured to generate signal charge based on radiation; and
at least two transistors per pixel used to read out the signal charge from the plurality of pixels,
wherein the at least two transistors are connected to each other in series,
wherein the at least two transistors each comprise:
a first nitride film adjacent to a substrate side, a first silicon oxide film, a semiconductor layer, and a second silicon oxide film laminated in order from the substrate side; and
a first gate electrode disposed such that the first or the second silicon oxide film is interposed between the first gate electrode and the semiconductor layer,
wherein the semiconductor layer comprises an active layer, and
wherein the first or the second silicon oxide film or both include an impurity element comprising at least one of antimony or bismuth.

2. The radiation image-pickup device according to claim 1, wherein
the at least two transistors each comprise the first gate electrode, the first silicon oxide film, the semiconductor layer, and the second silicon oxide film in order from the substrate side, and
the at least two transistors each further comprise a second gate electrode on the second silicon oxide film, disposed on a side of the semiconductor layer opposite to the first gate electrode.

3. The radiation image-pickup device according to claim 2, wherein
the first and the second silicon oxide films are disposed to be adjacent to the semiconductor layer, and
the first and the second silicon oxide films both include the impurity element.

4. The radiation image-pickup device according to claim 2, wherein, of the first and the second silicon oxide films, only the second silicon oxide film includes the impurity element.

5. The radiation image-pickup device according to claim 2, wherein, of the first and the second silicon oxide films, only the first silicon oxide film includes the impurity element.

6. The radiation image-pickup device according to claim 1, wherein the impurity element is provided in a selective region disposed opposite a channel part of the semiconductor layer, by doping.

7. The radiation image-pickup device according to claim 1, further comprising a pixel section comprising the plurality of pixels and a peripheral circuit section peripheral to the pixel section, wherein, of the pixel section and the peripheral circuit section, only the pixel section is doped with the impurity element.

8. The radiation image-pickup device according to claim 1, wherein the impurity element further includes fluorine (F).

9. The radiation image-pickup device according to claim 1, wherein a dosage of the impurity element is about $1.0 \times 10^{11}$ atoms per square centimeter or more, and about $1.0 \times 10^{13}$ atoms per square centimeter or less.

10. The radiation image-pickup device according to claim 1, wherein the at least two transistors each comprise the first silicon oxide film, the semiconductor layer, the second silicon oxide film, and the first gate electrode in order from the substrate side.

11. The radiation image-pickup device according to claim 10, wherein, of the first and the second silicon oxide films, at least the second silicon oxide film includes the impurity element.

12. The radiation image-pickup device according to claim 1, wherein the at least two transistors each comprise the first gate electrode, the first silicon oxide film, the semiconductor layer, and the second silicon oxide film in order from the substrate side.

13. The radiation image-pickup device according to claim 12, wherein, of the first and the second silicon oxide films, at least the first silicon oxide film includes the impurity element.

14. The radiation image-pickup device according to claim 1, wherein the semiconductor layer includes polycrystal silicon, micro-crystal silicon, amorphous silicon, or an oxide semiconductor.

15. The radiation image-pickup device according to claim 14, wherein the semiconductor layer comprises poly-silicon.

16. The radiation image-pickup device according to claim 1, further comprising a wavelength conversion layer,
  wherein the plurality of pixels each comprise a photoelectric conversion element, and
  the wavelength conversion layer is provided on a light incident side of the plurality of pixels, and configured to convert the radiation to a wavelength in a sensitivity range of the photoelectric conversion element.

17. The radiation image-pickup device according to claim 1, wherein the plurality of pixels each comprise a conversion layer configured to generate the signal charge by absorbing the radiation.

18. The radiation image-pickup device according to claim 1, wherein the radiation comprises X-rays.

19. The radiation image-pickup device according to claim 1, wherein the at least two transistors each further comprise a second nitride film laminated adjacent to the second silicon oxide film such that at least part of the second silicon oxide film is between the semiconductor layer and the second nitride film.

20. The radiation image-pickup device according to claim 1, wherein the first nitride film comprises silicon nitride.

* * * * *